(12) United States Patent
Breitschädel et al.

(10) Patent No.: US 8,130,126 B2
(45) Date of Patent: Mar. 6, 2012

(54) ANALOG TO DIGITAL CONVERSION SYSTEM

(75) Inventors: Hannes Breitschädel, Vienna (AT); Sabine Ferdan, Vienna (AT)

(73) Assignee: AKG Acoustics GmbH, Vienna (AT)

( * ) Notice: Subject to any disclaimer, the term of this patent is extended or adjusted under 35 U.S.C. 154(b) by 15 days.

(21) Appl. No.: 12/684,633

(22) Filed: Jan. 8, 2010

(65) Prior Publication Data
US 2010/0176980 A1   Jul. 15, 2010

(30) Foreign Application Priority Data
Jan. 9, 2009  (EP) .................................. 09450005

(51) Int. Cl.
*H03M 1/18* (2006.01)
(52) U.S. Cl. ........................ 341/139; 341/155
(58) Field of Classification Search ............. 341/139, 341/155
See application file for complete search history.

(56) References Cited

U.S. PATENT DOCUMENTS

| | | | | |
|---|---|---|---|---|
| 4,999,628 A | * | 3/1991 | Kakubo et al. | 341/139 |
| 5,714,956 A | * | 2/1998 | Jahne et al. | 341/155 |
| 6,333,707 B1 | * | 12/2001 | Oberhammer et al. | 341/155 |
| 2003/0016150 A1 | * | 1/2003 | Noll et al. | 341/139 |
| 2008/0272950 A1 | * | 11/2008 | Eastty et al. | 341/155 |

FOREIGN PATENT DOCUMENTS

| | | |
|---|---|---|
| EP | 1 253 518 | 2/2005 |
| EP | 2207264 A1 * | 7/2010 |
| WO | WO 2006109013 A1 * | 10/2006 |

* cited by examiner

OTHER PUBLICATIONS

*The Digitally Interfaced Microphone, The last step to a purely audio signal transmission and processing chain*, S. Peus et al., Presented at the 110th AES Convention, May 12-15, 2001, Amsterdam, The Netherlands.

*Primary Examiner* — Howard Williams
(74) *Attorney, Agent, or Firm* — Brinks Hofer Gilson & Lione

(57) ABSTRACT

The system converts an analog input signal into a digital output signal while avoiding interference, such as clipping. The system derives two signal components having differing signal magnitude levels from the analog input signal. The signal components are subjected to independent analog to digital conversion, such as through low resolution analog to digital converters. The system determines weighting factors for the two signal components based on at least one property of at least one of the signal components, such as the level of at least one of the signal components. The signal components are weighted. The weighted signal components are merged.

22 Claims, 10 Drawing Sheets

ANALOG TO DIGITAL CONVERSION SYSTEM

PRIORITY CLAIM

This application claims the benefit of priority from European Patent Application No. 09450005.5, filed Jan. 9, 2009, which is incorporated by reference.

BACKGROUND OF THE INVENTION

1. Technical Field

This disclosure relates to devices which convert analog input signals into digital output signals and particularly to systems which convert analog input signals into digital output signals using low resolution analog to digital converters.

2. Related Art

Analog to digital (A/D) conversion may be used in many applications including digital microphony. In digital microphony, signals with a wide dynamic range are transmitted while maximizing the signal-to-noise ratio (SNR). High performance analog to digital converters may be used for this purpose. However, high performance converters may be expensive and may consume a significant amount of power, making high performance converters undesirable for portable applications, such as radio microphones.

Gain staging may attempt to avoid these costs by splitting the analog input signal into two analog signal components and subjecting the two analog signal components to different levels of amplification. The two analog signal components may occur in different signal paths having different signal levels and may be independently subjected to independent A/D conversion. If a signal component subjected to a high amplification increases above a threshold, clipping may occur in an A/D converter. In this instance, a switchover to the lower level signal component or the corresponding signal path may occur. Due to its lower level, clipping may not occur in the corresponding A/D converter.

In gain staging two or more low-resolution converters may be used in place of one high-resolution converter without limiting or influencing the dynamic range that is available for transmission. The gain staging, however, is caused by switching between the two signal paths, which may require a precise matching of the digitized signal components to each other. The digitized signal components may need to be matched in both the amplitude and the phase. Time shifts as small as a nanosecond may cause unwanted interferences at the "junctions" at which one signal component is attached to the other signal component The effort expended by the complicated matching of the signal components is not related to the simplification of the actual A/D conversion.

Other systems that replace a high resolution A/D converter with multiple low resolution A/D converters may pass signal components through a nonlinear network. After passing through the nonlinear network the signal components are directed into two signal paths. One of the signal components is distorted such that it contains substantially no useful information from the input signal below a threshold signal level. The other signal component results from the addition of the input signal with a correct sign to the distorted signal component. A complementary distorted signal shape is produced. After performing an A/D conversion of the two signal components, the original input signal is reconstructed through the addition of the two digitized signal components. Since the distortion of the signal components may be accurately complementary, the resulting signal may be an undistorted digital output signal. The decrease in amplitude due to the subtraction of the distorted signal may prevent the corresponding A/D converter from reaching the clipping level. While these systems may avoid some of the problems of switching between the signal paths, there may be interferences in these systems, such as when the analog input signal has high signal and noise amplitudes.

SUMMARY

A system for converting an analog input signal into a digital output signal may include an analog input, signal amplitude modifiers, analog to digital converters and a processor. The analog input may be operative to receive continuously variable signals. The continuously variable signals may be subjected to the signal amplitude modifiers to derive analog signal components with different magnitude levels. The analog to digital converters may each convert one of the analog signal components into a digitized signal component. The processor may be programmed to determine weighting factors for the digitized signal components. The processor may apply the weighting factors to the digitized signal components. The processor may combine the digitized signal components, in accordance with the applied weighting factors, into an output signal.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
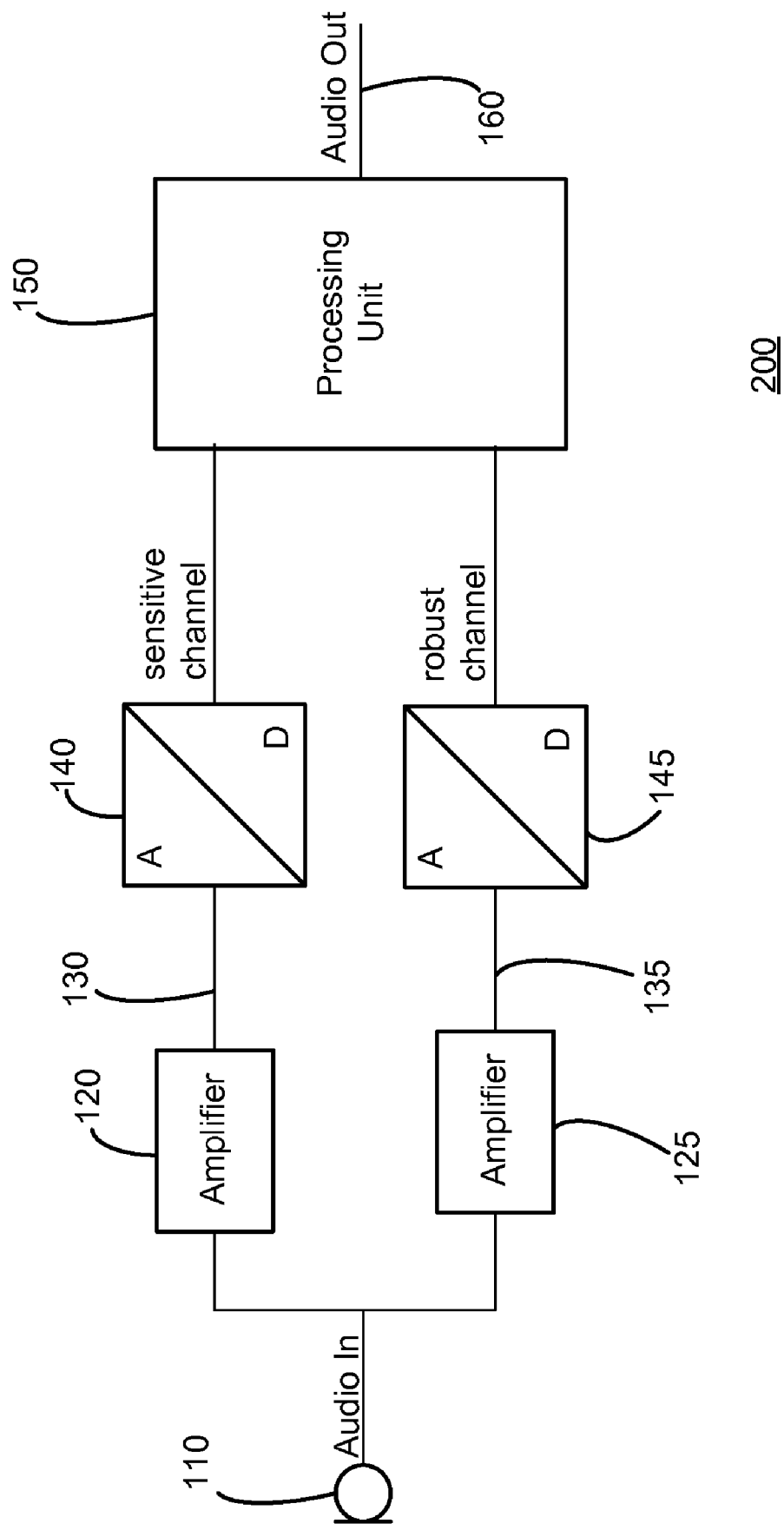
FIG. 1 shows a system that converts a continuously varying signal to a digital signal.

A conversion system converts an analog input signal into a digital output signal while minimizing signal interference, such as clipping. The system may derive two or more analog signal components having different signal magnitude levels from the analog input signal. The analog signal components may be derived by subjecting a continuously varying signal to one or more amplifiers or attenuators having different magnitude levels. Analog signal components may be individually digitized, such as by individually passing the analog signal components through low resolution analog to digital converters. The system may determine weighting factors for each digitized signal component. The weighting factors may be based on a determinable property of digitized signal components. The individual digitized signal components may be added, or combined, through weighting factors. The weighting factors may be used to crossfade between the signal components, which may minimize interference. The weighting and subsequent joining of the individual signal components may allow the system to react to changing characteristics of the analog input signal. The fractional content of each of the signal components in the output signal may be adapted to static or dynamic conditions and minimize interference.

The system may base weighting factors on any determinable property of one or more signal components, or of the input signal. The system may use a criterion for determining when to change the weighting of the signal components, e.g., the signal magnitude, the signal-to-noise ratio, harmonic distortion, clipping, etc. For example, the system may base the weighting factors on the magnitude level of one, two, or more signal components. The system may use the magnitude of the signal to determine when to recalculate the weighting of the signal components. The magnitude of the signal may be associated with the occurrence of clipping. Clipping occur when the magnitude of the signal exceeds a threshold value. To avoid clipping, the system may change the weighting of the signal components when the magnitude of the signal satisfies the threshold value. The system may crossfade the weighted signal components to produce a resulting output signal. The crossfading may occur continuously; it may occur through a constant adjustment of the weighting factors. The transition between weighting factors may occur incrementally to ensure a smooth adjustment.

In some systems the change in the weighting factors may be time-delayed, which may ensure a slow weighting adjustment. For example, the change may be time-delayed if the signal magnitude level decreases after a threshold is satisfied. In this example the weighting factor of the more amplified signal may be increased to represent the amplified signal component more prominently in the output signal. Due to the slow adjustment of the weighting, the crossfading of the signal components may not be perceptible to the listener. In other systems, the change in the weighting factors may be in real-time.

FIG. 1 is a system 100 that converts an analog input signal into a digital output signal. The system 100 may include input device 110 that converts sound into analog signals, such as a microphone. The system 100 may also include first amplifier 120, second amplifier 125, first signal path 130, second signal path 135, first analog to digital converter (ADC) 140, second ADC 145, processing unit 150, and output signal 160.

In operation, the system 100 may process an analog input signal from input device 110, such as an input signal received from a microphone. The system 100 may derive two signal components of the analog input signal having different magnitudes by subjecting the analog input signal to amplifiers 120 and 125. Amplifiers 120 and 125 may have different gain. For example, amplifier 120 may have an amplification of about +30 decibels (dB), while amplifier 125 may have an amplification of about +0 dB. Thus, in this example amplifier 120 may have a stronger amplification than amplifier 125. Alternatively, or in addition, the system 100 may utilize an attenuator and an amplifier to derive signal components having different magnitude levels from the analog input signal. The system 100 may use two or more attenuators to derive two signal components having different magnitude levels from the analog input signal. Alternatively, or in addition, the system 100 may utilize any combination of signal amplitude modifiers to derive signal components having different magnitude levels from the analog input signal.

The two analog signal components may be substantially shifted to the same phase and a substantially constant magnitude ratio over an entire transmitted frequency range. This may have a beneficial effect, such as at low frequencies (about <50-60 Hertz), in that the emergence of unwanted artifacts at low frequencies may be minimized during the subsequent joining of the digitized signal components by processing unit 150.

Signal path 130 may have the signal component with a higher magnitude level, due to amplifier 120 having the higher amplification, and may be referred to as the "more sensitive" signal path 130 or sensitive channel 130. Signal path 135 may have the signal component with a lower magnitude level, due to the amplifier 125 having the lower amplification, and may be referred to as the "robust" signal path 135 or robust channel 135. The analog signal components may be digitized by respective ADCs 140 and 145. The digitized signal components may be weighted and smoothly crossfaded, in accordance with the weights, by processing unit 150 to generate output signal 160.

The system 100 may achieve a substantially high analog to digital conversion resolution. Some systems 100 may have signal-to-noise ratio (SNR) of approximately 120 dB. Losses associated with an SNR of only approximately 85 dB of individual ADCs 140 and 145 may be dampened or minimized by the smooth crossfading of sensitive channel 130 and robust channel 135.

Figure 2:
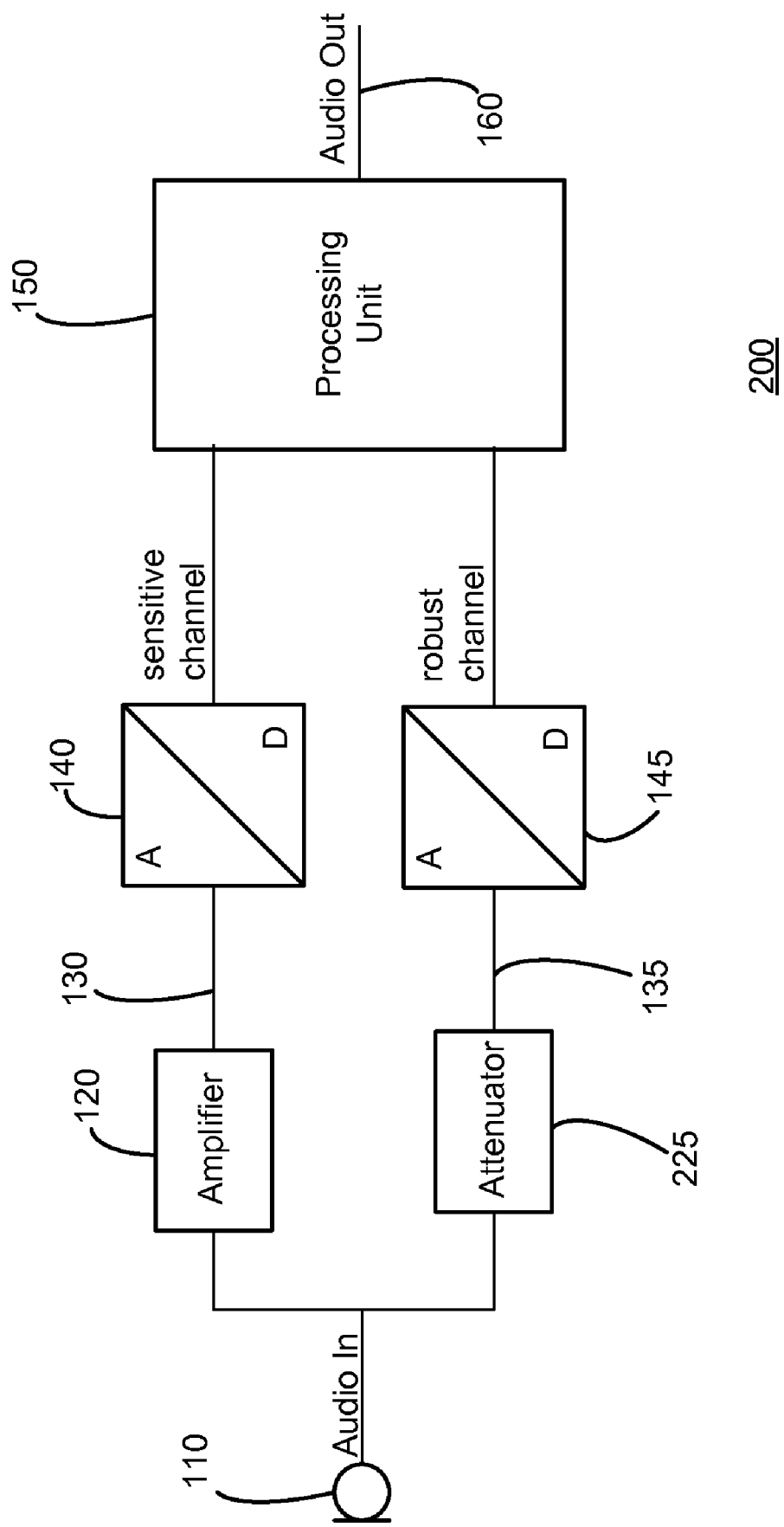
FIG. 2 is a block diagram of a converter.

FIG. 2 is a system 200 utilizing amplifier 120 and attenuator 225 that derives two signal components. The magnitude of the analog input signals may differ. The system 200 may include input device 110, such as a microphone, amplifier 120, attenuator 225, such as a voltage divider, first signal path 130, second signal path 135, first ADC 140, second ADC 145, processing unit 150, and output signal 160.

In operation, the system 200 may process an analog input signal from input device 110. The system 200 may derive two signal components of the analog input signal having different magnitudes by processing the analog input signal by amplifier 120 and/or attenuator 225. Amplifier 120 and attenuator 225 may amplify and/or attenuate the analog input signal. For example, amplifier 120 may have an amplification of approximately +30 dB, while attenuator 225 may attenuate the analog input signal by approximately −30 dB. Alternatively, or in addition, the system 200 may utilize two or more amplifiers to derive signal components having different magnitude levels from the analog input signal, or may utilize two attenuators. Alternatively, or in addition, the system 200 may include any combination of signal amplitude modifiers to derive signal components having different magnitude levels.

The analog signal components may be substantially shifted to about the same phase and a substantially constant magnitude ratio over an entire transmitted frequency range. This may minimize noise and/or interference at low frequencies (about <50-60 Hertz), in that the emergence of unwanted artifacts at low frequencies may be minimized during a subsequent merging of the digitized signal components by a processing unit 150.

Signal path 130 may have the signal component with a higher magnitude level, due to amplifier 120 having the higher amplification, and may be referred to as the "more sensitive" signal path 130 or sensitive channel 130. Signal path 135 may have the signal component with a lower magnitude level, due to the amplifier 125 having the lower amplification, and may be referred to as the "robust" signal path 135 or robust channel 135. The analog signal components may be digitized by respective ADCs 140 and 145. The digitized signal components may be weighted and smoothly crossfaded, in accordance with the weights, by processing unit 150 to generate output signal 160.

The system 200 may achieve a substantially high analog to digital conversion resolution and the system 200 may have signal-to-noise ratio (SNR) of approximately 120 dB which may be affected by a communication medium. Disadvantages associated with an SNR of individual ADCs 140 and 145 may be minimized by the smooth crossfading of sensitive channel 130 and robust channel 135.

Figure 3:
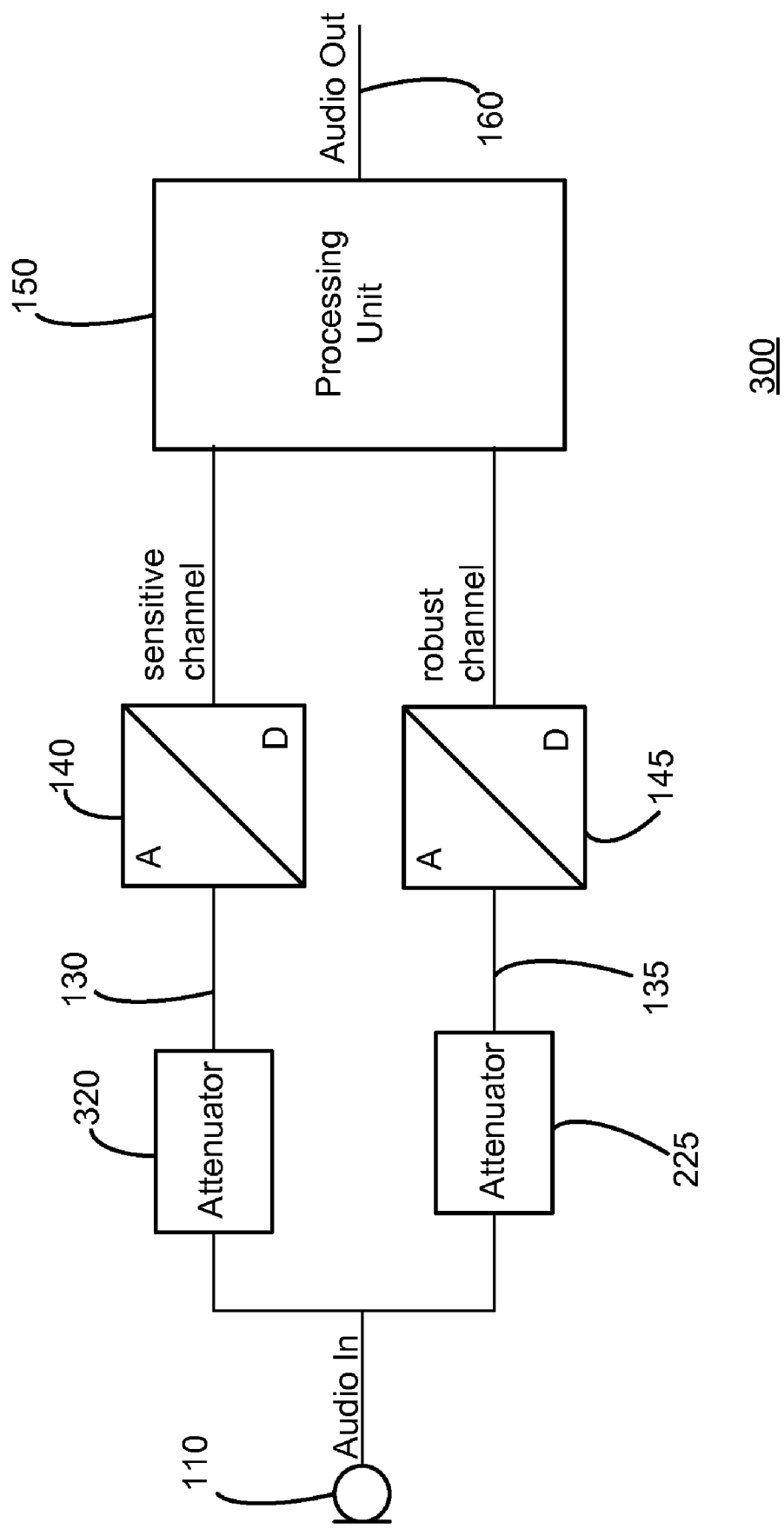
FIG. 3 is a block diagram of an alternative converter.

FIG. 3 shows a system 300 utilizing multiple attenuators 320 and 225 to derive two signal components with different magnitude levels from an analog input signal to be converted into a digital output signal. The system 300 may include input device 110, such as a microphone, first attenuator 320, such as a voltage divider, second attenuator 225, such as a voltage divider, first signal path 130, second signal path 135, first ADC 140, second ADC 145, processing unit 150, and output signal 160.

In operation, the system 300 may receive an analog input signal from the input device 110, such as a signal from a microphone. The system 300 may derive two signal components of the analog input signal having different magnitude levels by passing the analog input signal through attenuators 320 and 225. Attenuators 320 and 225 may attenuate the analog input signal at varying magnitude levels. For example, attenuator 320 may attenuate the analog input signal by about −10 dB, while attenuator 225 may attenuate the analog input signal by about −30 dB. Alternatively, or in addition, the system 300 may utilize two amplifiers, or an attenuator and an amplifier, to derive signal components having different magnitude levels from the analog input signal. Alternatively, or in addition, the system 300 may utilize any combination of signal amplitude modifiers to derive signal components having different magnitude levels from the analog input signal.

The two analog signal components may be substantially shifted to the same phase and a substantially constant magnitude ratio over the entire transmitted frequency range. This may have a beneficial effect, such as at low frequencies (about <50-60 Hertz), in that the emergence of unwanted artifacts at low frequencies may be prevented during the subsequent merging of the digitized signal components by the processing unit 150.

Signal path 130 may have the signal component with a higher magnitude level, due to amplifier 120 having the higher amplification, and may be referred to as the "more sensitive" signal path 130 or sensitive channel 130. Signal path 135 may have the signal component with a lower magnitude level, due to the amplifier 125 having the lower amplification, and may be referred to as the "robust" signal path 135 or robust channel 135. The analog signal components may be digitized by respective ADCs 140 and 145. The digitized signal components may be weighted and smoothly crossfaded, in accordance with the weights, by processing unit 150 to generate output signal 160.

The system 300 may achieve a substantially high analog to digital conversion resolution and the system 300 may have signal-to-noise ratio (SNR) of approximately 120 dB which may be affected by external wiring. Disadvantages associated with an SNR of individual ADCs 140 and 145 may be minimized by the smooth crossfading of sensitive channel 130 and robust channel 135.

Figure 4:
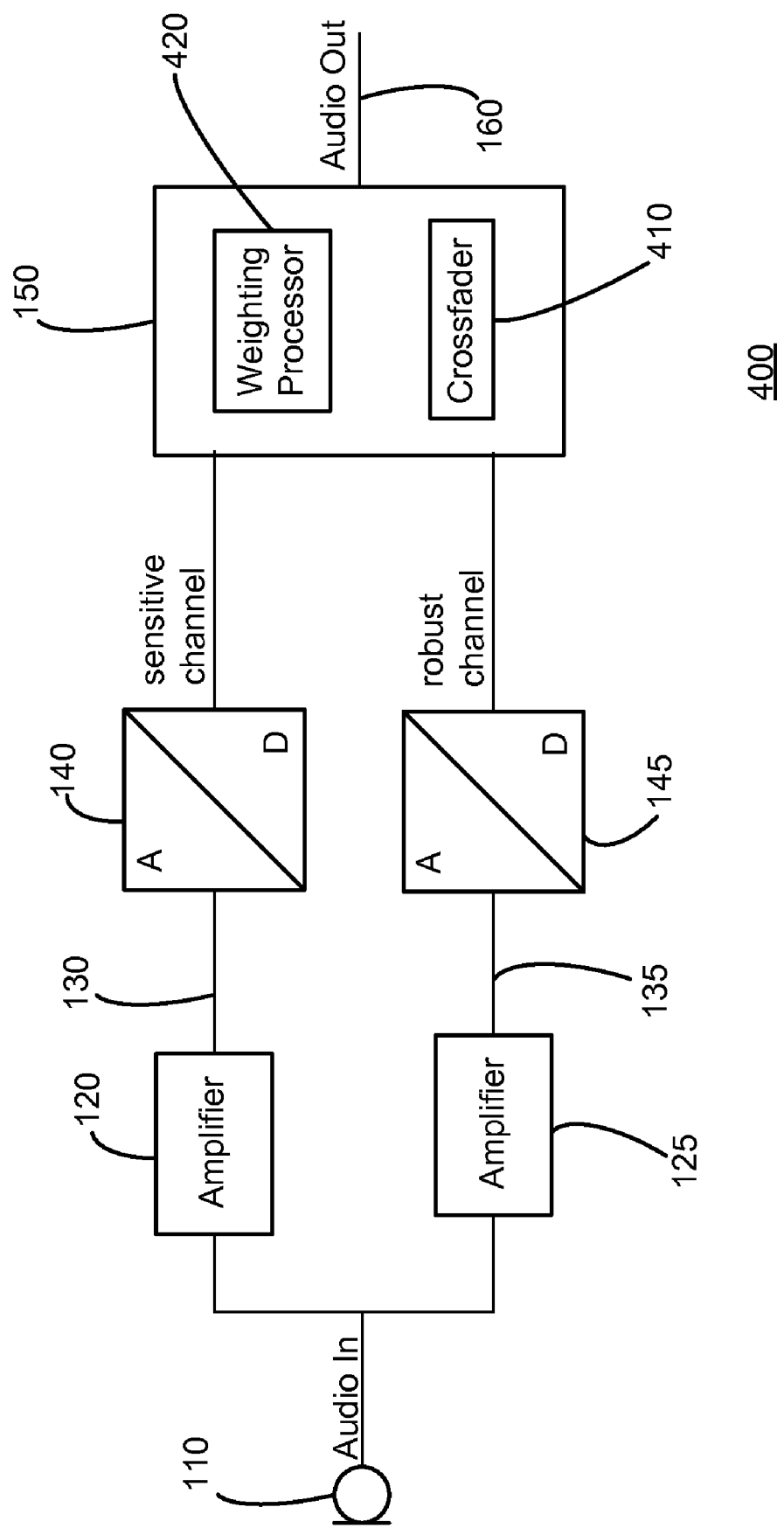
FIG. 4 is a block diagram of another alternative converter.

FIG. 4 shows the components of a processing unit 150 used in a system 400 that converts an analog input signal into a digital output signal. The system 400 may include input device 110, such as a microphone, first amplifier 120, second amplifier 125, first signal path 130, second signal path 135, first analog to digital converter (ADC) 140, second ADC 145, processing unit 150, and output signal 160. Processing unit 150 may include weighting processor 420 and crossfader 410.

In operation, the system 400 may receive an analog input signal from the input device 110, such as a signal from a microphone. The system 400 may derive two signal components of the analog input signal having different levels by passing the analog input signal through amplifiers 120 and 125. Amplifiers 120 and 125 may have differing amplifications. For example, amplifier 120 may have an amplification of about +30 decibels (dB), while amplifier 125 may have an amplification of about +0 dB. Thus, amplifier 120 may have a stronger amplification than amplifier 125. Alternatively, or in addition, the system 400 may utilize an attenuator and an amplifier to derive signal components having different magnitude levels from the analog input signal, or the system 400 may use multiple attenuators to derive two signal components having different magnitude levels from the analog input signal. Some systems 400 may attenuate the analog input signal with a voltage divider.

The two analog signal components may be substantially shifted to the same phase and a substantially constant magnitude ratio over an entire transmitted frequency range. This may have a beneficial effect, such as at low frequencies (about <50-60 Hertz), when artifacts may be dampened at low frequencies may be during the merging of the digitized signal components by the processing unit 150.

Signal path 130 may have the signal component with a higher magnitude level, due to amplifier 120 having the higher amplification, and may be referred to as the "more sensitive" signal path 130 or sensitive channel 130. Signal path 135 may have the signal component with a lower magnitude level, due to the amplifier 125 having the lower amplification, and may be referred to as the "robust" signal path 135 or robust channel 135. The analog signal components may be digitized by respective ADCs 140 and 145. The digitized signal components may be weighted and smoothly crossfaded, in accordance with the weights, by processing unit 150 to generate output signal 160.

The system 400 may achieve a substantially high analog to digital conversion resolution and the system 400 may have signal-to-noise ratio (SNR) of approximately 120 dB which may be affected by external wiring. Disadvantages associated with an SNR of only approximately 85 dB of individual ADCs 140 and 145 may be minimized by the smooth crossfading of sensitive channel 130 and robust channel 135. Crossfader 410 of the processing unit 150 may merge, or crossfade, the digitized input signals in accordance with the weighting factors determined by weighting processor 420.

Figure 5:
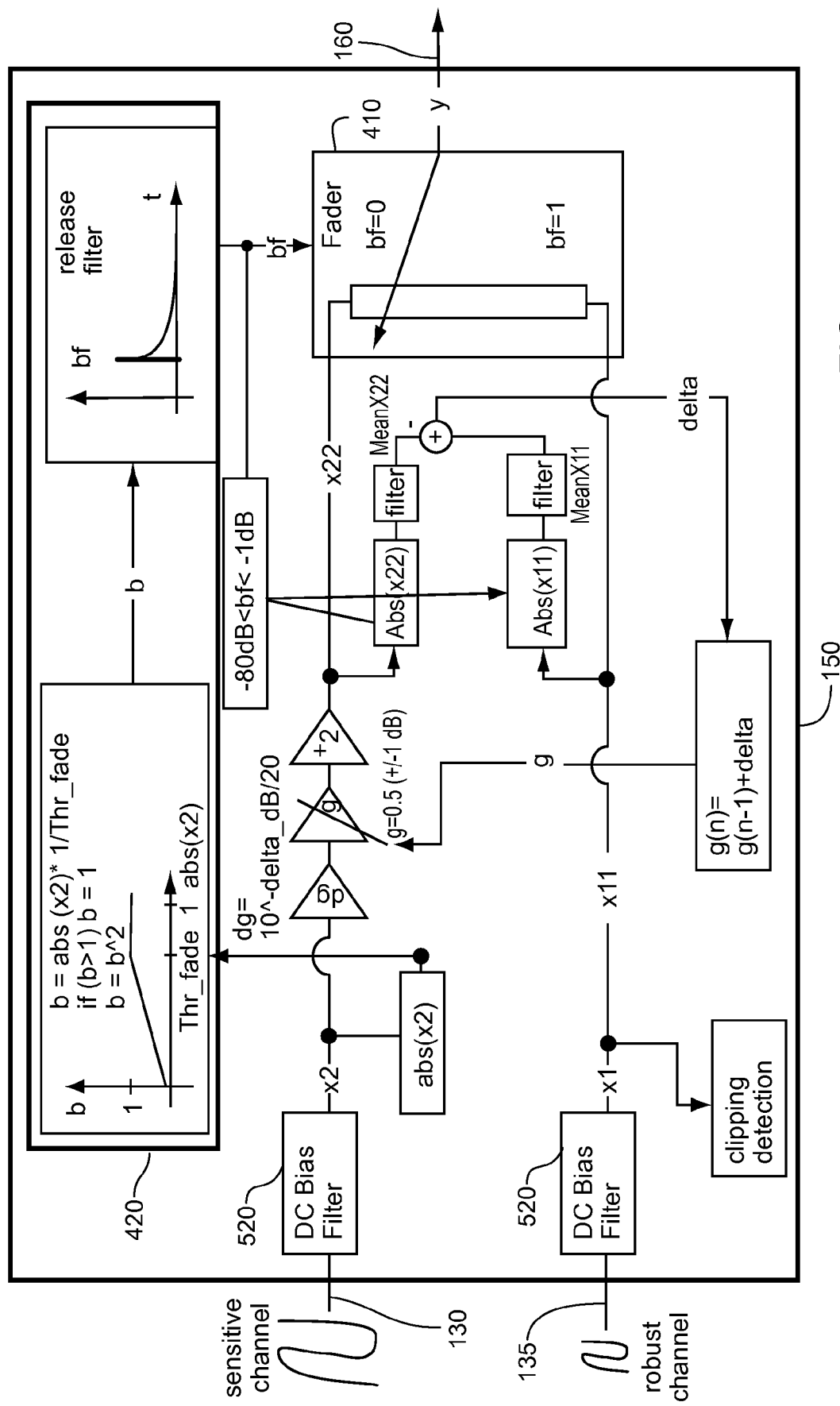
FIG. 5 is a processor that may be used in a converter.

FIG. 5 shows an exemplary processing unit 150 used in the conversion of an analog input signal into a digital output signal. Processing unit 150 may include crossfader 410, weighting processor 420, and direct current (DC) bias filters 520. Processing unit 150 may receive the digitized signal component having the higher amplification from first signal path 130, or sensitive channel 130, and the digitized signal component having the lower amplification from second signal path 135, or robust channel 135. In FIG. 5, the signal component in sensitive channel 130 may be referred to as 'x2,' and the signal component in robust channel 135 may be referred to as 'x1.' In FIG. 5, the magnitude level of the signal component x2 in sensitive channel 130 may be higher by a constant factor (e.g., between about 10 dB and about 40 dB) than the magnitude level of the signal component x1 in robust channel 135, due to the higher amplification of amplifier 120 than amplifier 125 in FIG. 1. If the magnitude level of the signal component x2 in sensitive channel 130 reaches a magnitude level associated with clipping, or a clipping level, then processing unit 150 may crossfade to robust channel 135. The output of processing unit 150 may be output signal 150, represented by 'y' in FIG. 5 and the description thereof.

Signal paths 130 and 135 may be coupled to DC bias filters 520, weighting processor 420 and crossfader 410. DC bias filters 520 may be used to exclude malfunctions from subsequent parts of the analog to digital conversion due to DC component. DC bias filters 520 may remove any DC component from the signal component x1 and x2. For example, DC bias filters 520 may operate like a high-pass filter.

In FIG. 5, the signal component x11 may be substantially similar to the signal component x1. The signal component x22 may be obtained from the signal component x2 by a correction in signal magnitude level. However, the signal components x11 and x22 should have the same magnitude level before being merged in crossfader 410 to avoid unwanted signal variations in output signal 150. In order to ensure the signal components have the same magnitude level, the signal component x2 is attenuated with an attenuator. Alternatively or in addition, the signal component x1 may be amplified, or the appropriate adjustment could be performed in crossfader 410 by adapting the weighting factors accordingly.

Weighting processor 420 may determine the weighting factor bf. The digitized signal components x11 and x22 may be weighted with the weighting factor of bf, or 1-bf, and merged in crossfader 410, also referred to as fader. Output signal 150 is the result of the merging of the signal components x11 and x22. Thus, an exemplary equation describing the crossfading of the digitized signal components x11 and x22 may be: y=x22*(1-bf)+(x11*bf). In this exemplary equation, the weighting factor bf may have a value between about 0 and about 1.

In operation, the signal component x22 may be produced from the signal component x2 by multiplication with a constant gain dg. The constant gain may correspond to the difference in signal magnitude level between the input signal x1 in robust channel 135 relative to the signal magnitude level of the input signal x2 in sensitive channel 130. In the signal flow, a variable gain g, may be used to adaptively adjust possible tolerances due to external component variations. The variable gain g may follow the constant gain dg. For example, a control range may be approximately +/−1 dB. The variable gain g may be determined by determining the average value, MeanX11 or MeanX22, of the respective absolute values abs(x11) or abs(x22) of the signal components x11 and x22. The two absolute values may be subtracted from each other resulting in a difference delta Δ. The difference delta Δ may be used to modify the gain g(n) closed loop, where:

Δ=MeanX11−MeanX22, and g(n)=g(n−1)+delta, where n is the corresponding sampled value.

The gain g(n) may be adjusted if the weighting factor bf is within a range, such as about 0.0001 to about 0.9, so as to avoid side effects and misadaptations.

In one system the signal processing may be performed in a fixed point computer system which may not permit multiplications of numbers greater than 1. In this system the adaptive gain may be achieved through two steps. The first step may operate with a variable of approximately 0.5 and may be followed by a second step of a fixed amplification by a factor of approximately 2. The following equation may describe the steps: x22=x2*dg*g*2.

The weighting factors bf and 1-bf may be calculated by the weighting processor 420 as a function of a determinable property of one of the signal components, such as the magnitude level of one of the signal components. For example, the magnitude level of the signal component x2 in sensitive channel 130 may be used as a reference parameter for the weighting factor calculation. The magnitude of the magnitude level of the signal may be determined in the form of an absolute value, abs(x2). Alternatively, or in addition, the magnitude level of the signal may be determined in the form of the root mean square (RMS) of the peak value, and/or the rectification value. An intermediate variable, b, may be calculated based on the magnitude level of the signal x2 using the following equation:

$$b = \left(\text{abs}(x2) * \frac{1}{\text{Thr\_fade}}\right)^2, \text{ where if } (b > 1), b = 1.$$

The variable Thr_fade may define an adjustable threshold value, which may correspond to the upper range of the analog to digital converter. In some systems the adjustable threshold value may be below the upper range of the analog to digital converter, such as approximately −6 dB. An adjustable threshold value below the upper range of the analog to digital converter may allow crossfader 410 to crossfade to robust channel 135 quickly enough to avoid the occurrence of clipping in one of the analog to digital converters becoming audible in output signal 160.

If the magnitude level abs(x2) of signal component x2 is greater than the threshold value Thr_fade, then b=1. The intermediate variable b follows a square characteristic, so that the intermediate value b decreases continuously quadratically with the falling signal magnitude abs(x2).

Weighting processor 420 calculates the weighting factor bf from the intermediate variable b using a smoothing filter, such that the weighting factor bf is rapidly adjusted with rising intermediate value b. The weighting factor bf may decrease according to a first order low-pass filter with a falling intermediate value b. This behavior may be comparable with that of a release filter of an audio compressor. The smoothing filter may be described by the following equation:

$$bf = bf * \text{coeff}, \text{ where } \text{coeff} = e^{\frac{-2.2}{\text{SampleRate} * \text{TimeConst}}}$$

If the intermediate value b is greater than the determined weighting factor bf, then the weighting factor bf is set equal to the intermediate value b. The variable SampleRate may be the sampling rate of the analog to digital converter. The variable TimeConst may describe the time response. If the value chosen for TimeConst is too small, there may be unwanted artifacts in output signal 160 resulting from crossfader 410 following the waveform of very low frequent signals. If the filter is too slow the noise tail due to switching between robust channel 135 and sensitive channel 130 may not be hidden by forward temporal masking of the ear. In some systems the TimeConst variable may be selected at about 0.1 seconds, which may cause the coeff to have a value of about 0.9995.

The square dependence of the weighting factors bf and 1-bf respectively on the signal magnitude abs(x2) may enable the system 100 to react very rapidly to increasing signal magnitude level, and the weighting of the signal components in resulting output signal 160 may be changed rapidly. If the signal magnitude abs(x2) decreases again, the weighting factors bf or 1-bf, respectively, are updated with a time delay. The inertia of the system 100 with decreasing signal strength provides a smooth crossfading of the two signal paths 130 and 135, and ensures that the crossfading process does not become audible to a user. The selection of the time constants TimeConst of approximately 0.1 s may allow the crossfading to execute within the masking interval of human auditory perception.

Crossfader 410 may be controlled with the weighting factors bf or 1-bf, respectively. For example, if bf=1, only the signal component x11 of robust channel 135 may be included in output signal 160. In another example, if bf=0, only the signal component x22 of sensitive channel 130 may be included in output signal 160. Smooth crossfading of the signal components may occur when the value of bf is between about 0 and about 1.

As explained, certain actions may be preferred in the analog portion of the circuit, such as to provide improved transmission of low frequencies in the system 100. The two analog signal components should have a magnitude level ratio which is as constant as possible over all of the frequencies as well as no phase shift. Phase shifts and frequency dependent differences in signal magnitude levels may act as distorting factors at very low audio frequencies since crossfader 410 may follow the signal shape of the audio signal directly.

Alternatively or in addition, one or more latency components may be built into signal paths 130 and 135. The latency components may enable a time-delayed increase of the weighting factor bf, such that a smooth crossfading of signal paths 130 and 135 is enabled before clipping occurs.

Alternatively or in addition, other algorithms may be used for generating the weighting factors as a function of a determinable property of one of the signal components. For example, other algorithms may not include the square dependency of the weighting factors on the signal magnitude level. Furthermore, the time delay in adjusting the weighting factor may also behave differently than a first order low-pass filter.

Figure 6:
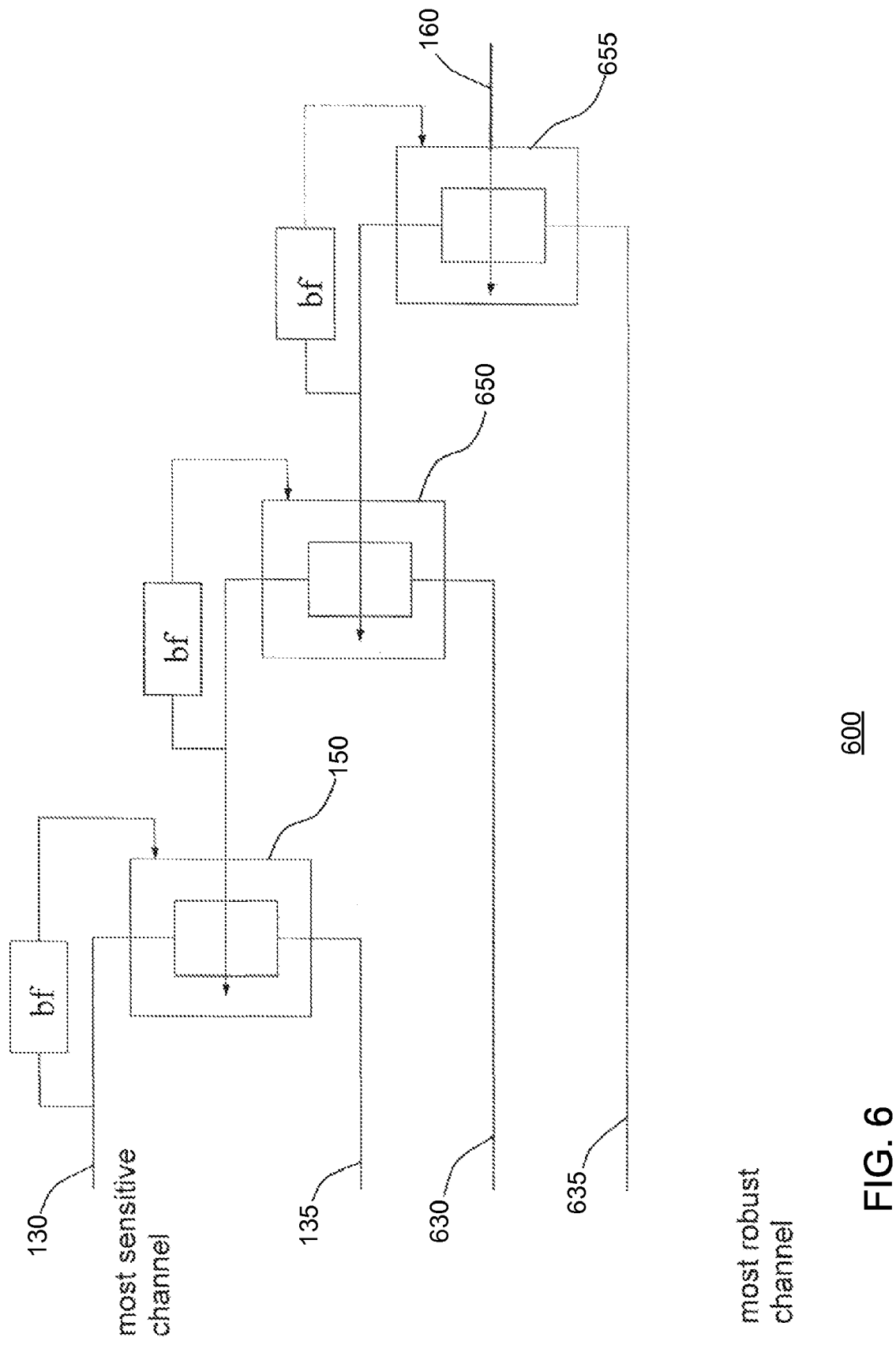
FIG. 6 is a multiple input bus to a common output.

FIG. 6 shows a system 600 for combining more than two analog signal components having different magnitude levels from an analog input signal to be converted into a digital output signal. The system 600 may include first signal path 130, second signal path 135, third signal path 630, fourth signal path 635, first processing unit 150, second processing unit 650, and third processing unit 655. Alternatively, or in addition, the system may only utilize processing unit 150 to perform the signal processing for all of paths 130, 135, 630 and 635. Alternatively or in addition, the system 600 may include any number of additional signal paths. Signal paths 130, 135, 630 and 635 may also be referred to as channels.

In operation, the signal components are derived from the analog input signal, with each signal component having a different signal magnitude level. First signal path 130 may have the highest signal magnitude level and may be referred to as the "most sensitive channel," while fourth signal path 635 may have the lowest signal magnitude level and may be referred to as the "most robust channel." The system 600 may start with signal path 130 and may successively crossfade to signal paths with respectively lower signal strengths. For example, if signal path 130 reaches the clipping magnitude level, processing unit 150 may crossfade over to signal path 135 having a lower signal strength. If signal path 135 reaches the clipping magnitude level, processing unit 650 may crossfade to signal path 630. The crossfading may continue across all of signal paths 130, 135, 630, 635.

Figure 7:
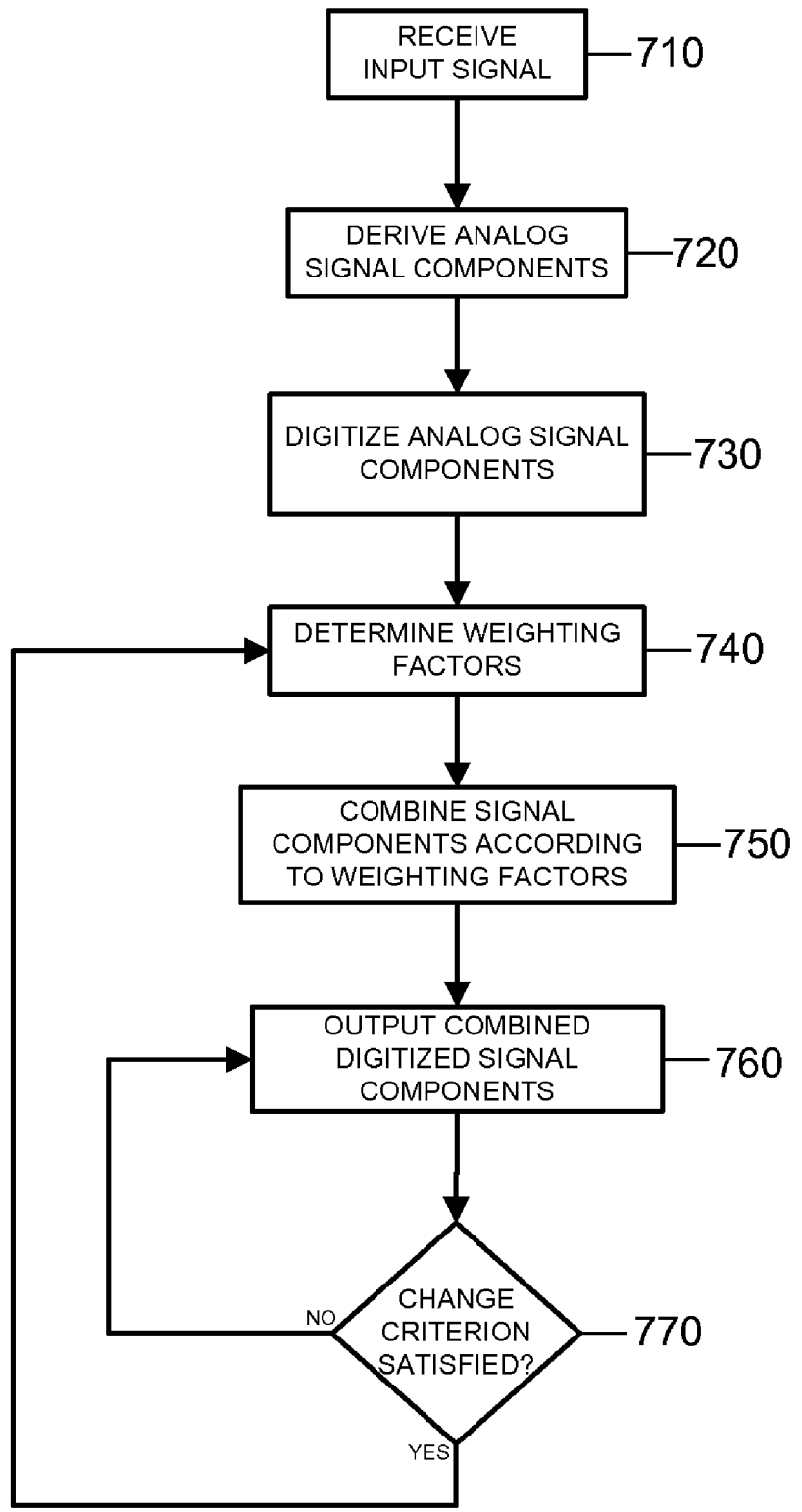
FIG. 7 is a process that converts a continuously varying signal into a digital output signal.

FIG. 7 is a flowchart demonstrating the conversion of an analog input signal into a digital output signal. The steps of FIG. 7 are described in serial for explanation purposes; however, one or more steps may occur simultaneously, or in parallel. At step 710, the system 100 may receive an analog input signal, such as from a microphone. At step 720, the system 100 may derive analog signal components having different signal magnitude levels from the analog input signal. For example, the analog input signal may be subjected to one or more amplifiers or attenuators which may amplify or attenuate the analog input signal at varying magnitude levels. At step 730, the system 100 may digitize the analog signal components, such as by passing the analog signal components through low resolution analog to digital converters.

At step 740, processing unit 150 may determine weighting factors to be applied to the digitized signal components. The weighting factors may be determined based on at least one determinable property of at least one of the digitized signal components, such as the magnitude level of one of the digitized signal components. At step 740, processing unit 150 may apply the weighting factors to the digitized signal components and combine the weighted digitized signal components, such as by adding the digitized signal components together. Processing unit 150 may utilize a time delay in applying the weighting factors so as to ensure the transition to the weighting factors is smooth. At step 760, the output signal resulting from the combination of the individual digitized signal components is outputted, such as through a speaker or other audio device.

At step 770, the system 100 determines whether a change criterion is satisfied by at least one property of one of the digitized input signals. As explained, the change criterion may be based on a property of one of the digitized signal components, such as the magnitude of one of the digitized signal components. In this example, the change criterion may be satisfied when the magnitude of the digitized signal component reaches a threshold level. If, at step 770, the system 100 determines that the change criterion is satisfied, the system 100 returns to step 740 and determines new weighting factors. At step 750, the digitized signal components are weighted and combined in accordance with the new weighting factors. At step 760, the combined digitized signal components are outputted. If, at step 770, the system 100 determines that the change criterion is not satisfied, the system 100 returns to step 760 and continues to output the combined digitized signal components in accordance with the last determined weighting factors. In some systems the step 770 may occur in parallel with the step 760.

Figure 8:
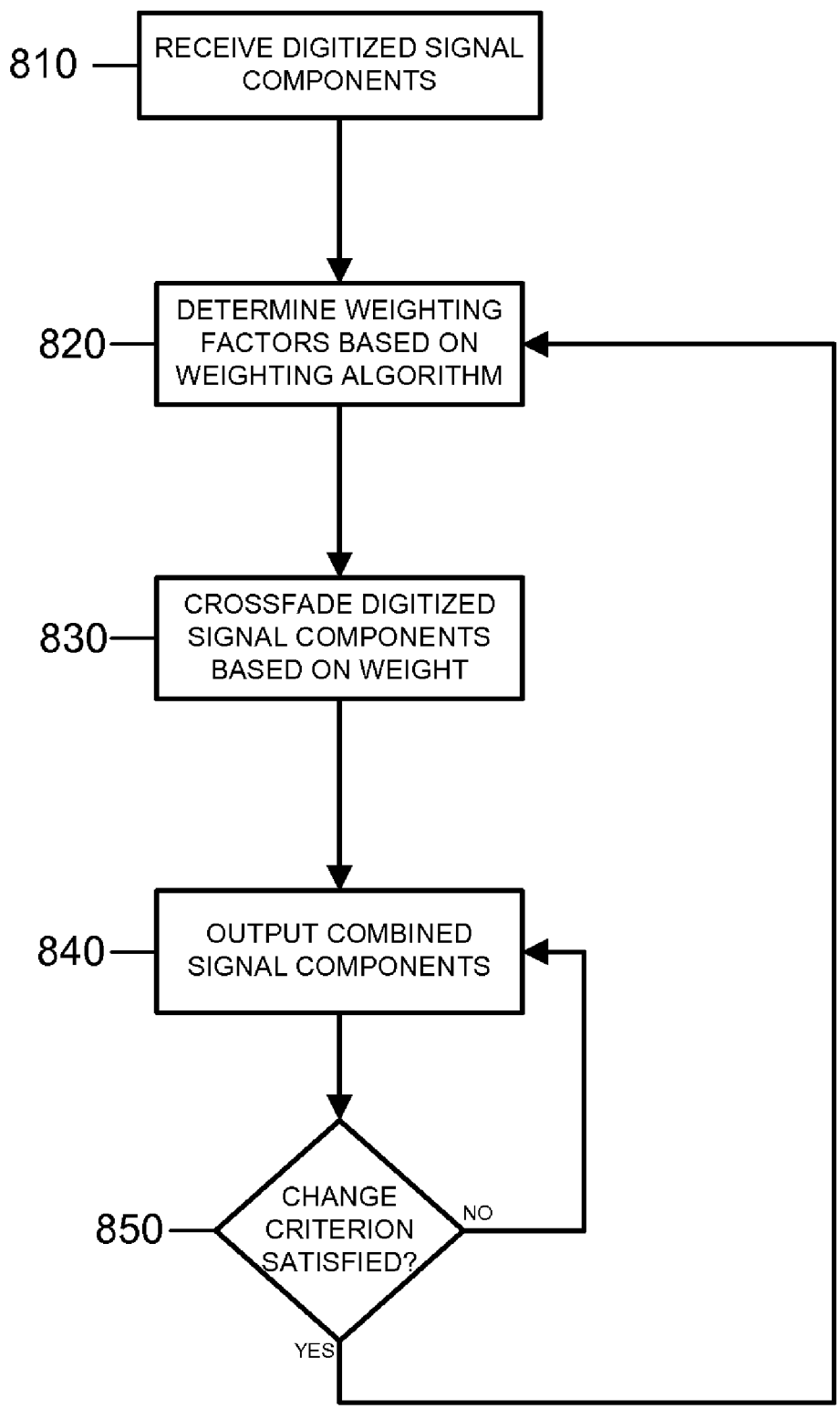
FIG. 8 is an exemplary operation of a processing unit.

FIG. 8 is a flowchart demonstrating operations of an exemplary processing unit used in the conversion an analog input signal into a digital output signal. The steps of FIG. 8 are described in serial for explanation purposes; however, one or more steps may occur simultaneously, or in parallel. At step 810, processing unit 150 may receive the digital signal components via the signal paths 130 and 135. At step 820, processing unit 150 may determine the weighting factors based on a weighting algorithm. At step 830, processing unit 150 may crossfade, or combine, the digitized signal components based on the determined weighting factors. At step 840, processing unit 150 may output the combined digital signal components, such as through an audio device.

At step 850, the system 100 determines whether a change criterion is satisfied by at least one property of one of the digitized input signals. As explained, the change criterion may be based on a property of one of the digitized signal components, such as the magnitude of one of the digitized signal components. In this example, the change criterion may be satisfied when the magnitude of the digitized signal component reaches a threshold level. If, at step 850, the system 100 determines that the change criterion is satisfied, the system 100 returns to step 820 and determines new weighting factors. At step 830, the digitized signal components are weighted and combined in accordance with the new weighting factors. At step 840, the combined digitized signal components are outputted. If, at step 850, the system 100 determines that the change criterion is not satisfied, the system 100 returns to step 840 and continues to output the combined digitized signal components in accordance with the last determined weighting factors. In some systems the step 850 may occur in parallel with the step 840.

Figure 9:
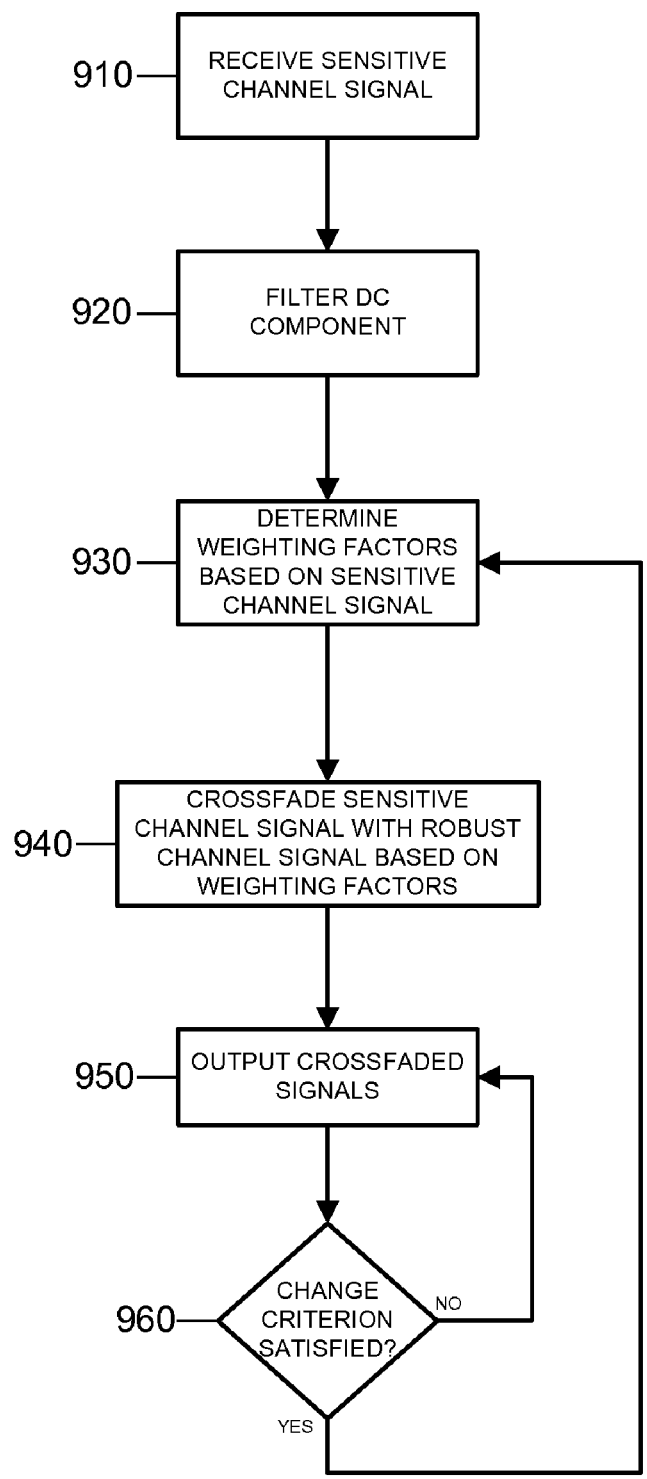
FIG. 9 is a process of selecting weighting factors based a determinable property of a sensitive channel signal.

FIG. 9 is a flowchart demonstrating the determination of weighting factors based on a determinable property of a sensitive channel signal of an analog input signal. The steps of FIG. 9 are described in serial for explanation purposes; however, one or more steps may occur simultaneously, or in parallel. At step 910, processing unit 150 may receive the sensitive channel signal, such as via signal path 130. In one example, the sensitive channel signal may be the signal having a higher magnitude level. At step 920, processing unit 150 may filter any DC component from the signal, such as to prevent the DC component from distorting the signal processing. At step 930, processing unit 150 may determine the weighting factors based on the sensitive channel signal. At step 940, processing unit 150 may crossfade the sensitive channel signal with the robust channel signal in accordance with the determined weighting factors. At step 950, processing unit 150 may output the crossfaded signals, such as through an audio listening device.

At step 960, the system 100 determines whether the change criterion is satisfied by at least one property of one of the digitized input signals. As explained, the change threshold may be based on a property of one of the digitized signal components, such as the magnitude of the sensitive channel signal. In this example, the change threshold may be satisfied when the sensitive channel signal reaches a threshold level. If, at step 960, the system 100 determines that the change criterion is satisfied, the system 100 returns to step 930 and determines new weighting factors based on the sensitive channel signal. At step 940, the digitized signal components are weighted and combined in accordance with the new weighting factors. At step 950, the combined digitized signal components are outputted. If, at step 960, the system 100 determines that the change criterion is not satisfied, the system 100 returns to step 950 and continues to output the combined digitized signal components in accordance with the last determined weighting factors. In some systems, the step 960 may occur in parallel with the step 950.

Figure 10:
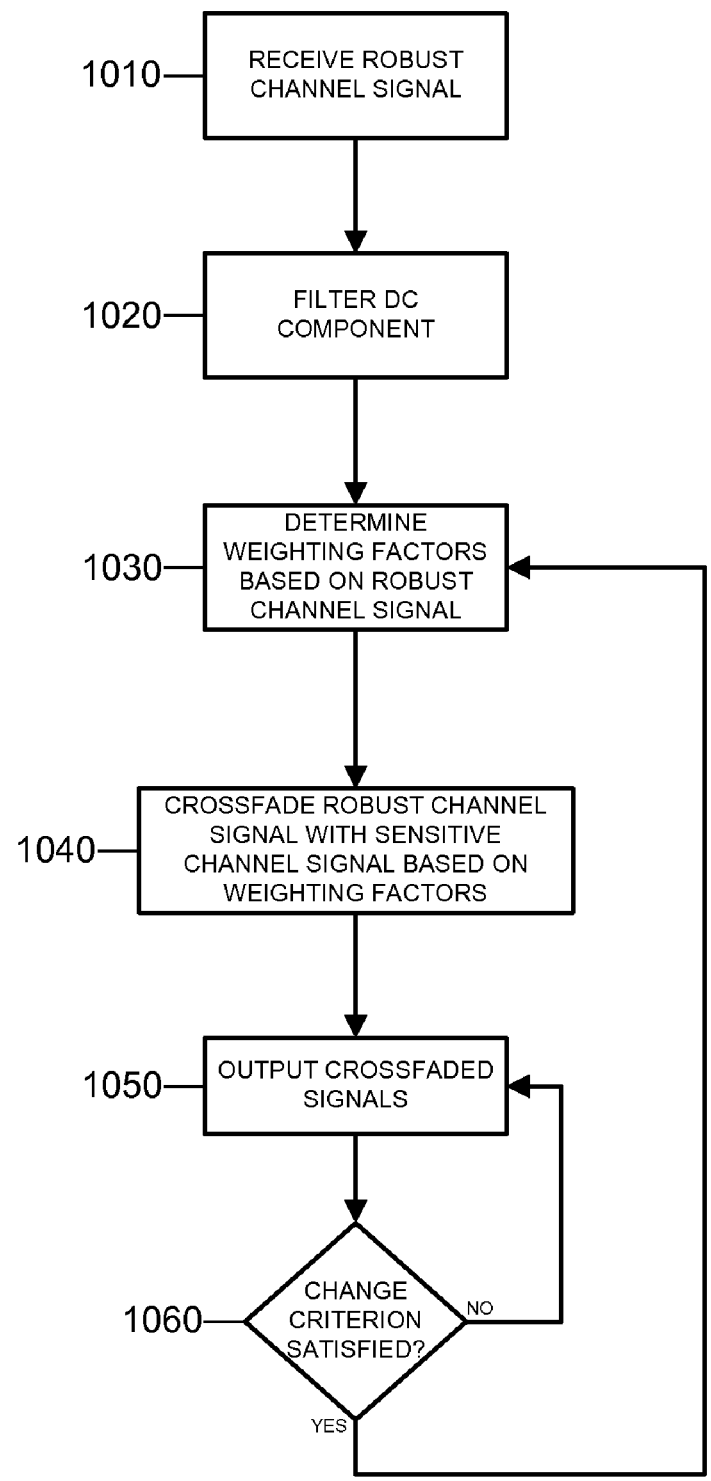
FIG. 10 is an alternative process of selecting weighting factors based on a determinable property of a robust channel signal.

FIG. 10 is a flowchart demonstrating the determination of weighting factors based on a determinable property of a sensitive channel signal of an analog input signal. The steps of FIG. 10 are described in serial for explanation purposes; however, one or more steps may occur simultaneously, or in parallel. At step 1010, processing unit 150 may receive the robust channel signal, such as via signal path 135. In one example, the robust channel signal may be the signal having the lower signal magnitude level. At step 1020, processing unit 150 may filter any DC component from the signal, such as to prevent the DC component from distorting the signal processing. At step 1030, processing unit 150 may determine weighting factors based on the robust channel signal. At step 1040, processing unit 150 may crossfade the sensitive channel signal with the robust channel signal in accordance with the determined weighting factors. At step 1050, processing unit 150 may output the crossfaded signals, such as through an audio listening device.

At step 1060, the system 100 determines whether the change criterion is satisfied by at least one property of the robust channel signal. As explained, the change criterion may be based on a property of one of the digitized signal components, such as the magnitude of one of the robust channel signal. In this example, the change criterion may be satisfied when the magnitude of the robust channel signal reaches a threshold level. If, at step 1060, the system 100 determines that the change criterion is satisfied, the system 100 returns to step 1030 and determines new weighting factors. At step 1040, the digitized signal components are weighted and combined in accordance with the new weighting factors. At step 1050, the combined digitized signal components are outputted. If, at step 1060, the system 100 determines that the change criterion is not satisfied, the system 100 returns to step 1050 and continues to output the combined digitized signal components in accordance with the last determined weighting factors. In some systems the step 1060 may occur in parallel with the step 1050.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method for converting an analog input signal into a digital output signal comprising:
   deriving a plurality of analog signal components having different signal magnitude levels from an analog input signal;
   converting the plurality of analog signal components into a plurality of digitized signal components having different signal magnitude levels using a plurality of analog to digital converters;
   determining a weighting factor for each of the plurality of digitized signal components, the weighting factors based on a first property of a digitized signal component of the plurality of digitized signal components and a threshold value corresponding to an upper range of the analog to digital converter used to convert the digitized signal component; and
   combining, by a signal processing device, the plurality of digitized signal components into an output signal, where the plurality of digitized signal components are combined in accordance with the weighting factor of each of the plurality of digitized signal components.

2. The method of claim 1 where the property of the plurality of digitized signal component of the plurality of digitized signal components comprises a signal magnitude level of the digitized signal component.

3. The method of claim 2 where the weighting factor of the digitized signal component of the plurality of digitized signal components decreases as the signal magnitude level of the digitized signal component increases.

4. The method of claim 2 where the signal magnitude level of the digitized signal component of the plurality of digitized signal components comprises a highest signal magnitude level of any of the plurality of digitized signal components.

5. The method of claim 4 where the weighting factor of the digitized signal component of the plurality of digitized signal components depends on a square of a signal magnitude level of another digitized signal component of the plurality of digitized signal components.

6. The method of claim 4 where the weighting factor of the digitized signal component of the plurality of digitized signal components increases in a time-delayed manner as the signal magnitude level decreases.

7. The method of claim 6 where a time response of a change in the weighting factor of the digitized signal component of the plurality of digitized signal components corresponds to a first-order low-pass filter.

8. The method of claim 1 where, prior to the analog to digital conversion, the plurality of analog signal components have a substantially similar phase and a substantially constant level ratio over an entire frequency range.

9. The method of claim 1 further comprising:
   determining whether a change criterion is satisfied by a second property of the digitized signal component of the plurality of digitized signal components; and
   modifying the weighting factor of each of the plurality of digitized signal components if the change criterion is satisfied by the second property of the digitized signal component.

10. The method of claim 9 where a latency component causes the modifying to occur in a time-delayed manner.

11. The method of claim 9 where the second property of the digitized signal component of the plurality of digitized signal components comprises a signal strength of the digitized signal component.

12. The method of claim 1 further comprising:
    adjusting the signal magnitude level of each of the plurality of digitized signal components prior to combining the plurality of digitized signal components.

13. The method of claim 1 where the analog to digital conversion is performed by a plurality of low resolution analog to digital converters.

14. The method of claim 1 where combining the plurality of digitized signal components into the output signal further comprises adding each of the plurality of digitized signal components together to generate the output signal.

15. A device for converting an analog input signal into a digital output signal comprising:
    an analog input operative to receive continuously variable signals subject to a plurality of signal amplitude modifiers to derive a plurality of analog signal components with different magnitude levels;
    a plurality of analog to digital converters that each convert one of the plurality of analog signal components into a digitized signal component; and
    a processor programmed to determine a weighting factor for each of the plurality of digitized signal components, apply the weighting factor to each of the plurality of digitized signal components and combine the plurality of digitized signal components into an output signal, where the combining is performed in accordance with the weighting factor of each of the plurality of digitized signal components, and where the weighting factor is based on a threshold value corresponding to an upper range of an analog to digital converter used to convert a digitized signal component of the plurality of digitized signal components.

16. The device of claim 15 where the weighting factor is determined as a function of a property of a digitized signal component of the plurality of digitized signal components.

17. The device of claim 16 where the property of the digitized signal component of the plurality of digitized signal components comprises the signal magnitude level of the digitized signal component.

18. The device of claim 15 further comprising a weighting processor coupled to the processor, where the weighting processor is operative to determine a property of a digitized signal component of the plurality of digitized signal components and modify the weighting factors of the plurality of digitized signal components as if the property satisfies a criterion.

19. The device of claim 18 further comprising a latency component coupled to the processor, where the latency component is operative to delay the modifying of the weighting factors of the plurality of digitized signal components.

20. The device of claim 15 where a first digitized signal component of the plurality of digitized signal components having a higher weighting factor is more audible in the output signal than a second digitized signal component of the plurality of digitized signal components having a lower weighting factor.

21. A radio microphone comprising:
    an analog input that receives an analog input signal and branches the analog input signal to at least two signal paths having different signal magnitude levels where each signal path comprises an analog to digital converter to provide a digitized signal component;
    a weighting processor that receives the digitized signal component, the weighting processor operative to determine the signal magnitude level in one of the at least two signal paths and generate weighting factors for the at least two signal paths as a function of the determined signal magnitude level, the weighting factors based on a threshold value corresponding to an upper range of the analog to digital converter used to convert the digitized signal component; and
    a crossfader, coupled to the weighting processor, the crossfader operative to apply the weighting factors to the at least two signal paths and join the at least two signal paths in accordance with the weighting factors.

22. The radio microphone of claim 21, where the weighting factor for a signal path equals zero when the analog input signal of the signal path has a magnitude level associated with clipping.

* * * * *